United States Patent [19]

Davies et al.

[11] Patent Number: 4,554,464
[45] Date of Patent: Nov. 19, 1985

[54] PROPAGATION DELAY GENERATOR

[75] Inventors: Robert B. Davies; Ira Miller, both of Tempe; Robert N. Dotson, Mesa, all of Ariz.

[73] Assignee: Motorola, Inc., Schaumburg, Ill.

[21] Appl. No.: 413,051

[22] Filed: Aug. 30, 1982

[51] Int. Cl.$^4$ ...................... H03K 3/017; H03K 5/04; H03K 17/56
[52] U.S. Cl. .................................. 307/265; 307/246; 307/268; 365/11
[58] Field of Search ............... 307/265, 266, 267, 268, 307/590, 597, 605, 606, 446, 470, 227, 475, 480, 296 A, 246, 297, 260; 365/11

[56] References Cited

U.S. PATENT DOCUMENTS

| | | | |
|---|---|---|---|
| 3,175,101 | 3/1965 | Van Dine | 307/265 |
| 3,492,502 | 1/1970 | Chang | 307/246 |
| 3,731,206 | 5/1973 | Veale | 307/267 |
| 3,906,247 | 9/1975 | Heffner | 307/265 |
| 3,916,221 | 10/1975 | Bayer | 307/590 |
| 3,963,944 | 6/1976 | Kristiansen | 307/265 |
| 4,126,795 | 11/1978 | Moorey | 307/227 |
| 4,246,499 | 1/1981 | Iida | 307/246 |
| 4,504,928 | 3/1985 | Davies et al. | 307/228 |

Primary Examiner—Stanley D. Miller
Assistant Examiner—Timothy P. Callahan
Attorney, Agent, or Firm—William E. Koch

[57] ABSTRACT

A propagation delay generator is provided for controlling the duration of a bubble generate waveform of a bubble memory system. A first means is responsive to a digital input signal and provides an initializing signal to a current source. A capacitor is charged, responsive to an R-C time constant, by an increased voltage level prompted by the initializing signal. A second means is responsive to the charging signal in excess of that required to charge the capacitor. The second means thereby provides a digital output that is delayed from the digital input signal.

6 Claims, 2 Drawing Figures

PROPAGATION DELAY GENERATOR

BACKGROUND OF THE INVENTION

1. Field of the Invention

This invention relates, in general, to propagation delay generators and more particularly to a circuit included in a bubble memory system that extends a bubble generate waveform for a specific time period.

2. Background Art

Bubble memory systems normally include a control amplifier that produces a bubble generate waveform that, through additional circuitry, produces a magnetic bubble for storing information. In order to ensure that a bubble is produced, the waveform must meet specific criteria relating to duration and fall time. The duration may typically be defined as that portion of the waveform including that which is equal to and greater than 90% of the peak amplitude.

Known bubble memory systems usually shape the bubble generate waveform by having external resistors and capacitors at the generate output. Waveshaping techniques in other applications have typically used complex circuits having a relatively large number of components wherein the components interact to shape the wave. However, these methods result in inefficiencies due to higher cost and larger space requirements.

Thus, what is needed is a propagation delay generator that controls the duration of the bubble generate waveform without external components.

SUMMARY OF THE INVENTION

Accordingly, it is an object of the present invention to provide an improved propagation delay generator.

Another object of the present invention is to provide a propagation delay generator wherein the duration of a pulse is determined through the interaction of a changing voltage versus the temperature coefficient of a resistor.

A further object of the present invention is to provide a propagation delay generator wherein the duration of a bubble generate waveform from a control amplifier of a bubble memory system is determined without using external components.

In carrying out the above and other objects of the invention in one form, there is provided an improved propagation delay generator having a first voltage conductor, a second voltage conductor, an input conductor responsive to a digital input signal and an output conductor, for generating a delayed digital output signal responsive to the digital input signal. An input gate means is coupled to the first and second voltage conductors and is responsive to the digital input signal from the input conductor for initializing a charging signal. A capacitive means is coupled to the first and second voltage conductors and the input gate means, and is responsive to the charging signal for providing a gating signal subsequent to receiving the charging signal. An output gate means is coupled to the first and second voltage conductor and the capacitive means, and is responsive to the gating signal for providing the output signal.

The above and other objects, features, and advantages of the present invention will be better understood from the following detailed description taken in conjunction with the accompanying drawings.

DETAILED DESCRIPTION OF THE INVENTION

Bubble memory systems typically have a control amplifier that generates a waveform that produces, through additional circuitry, a magnetic bubble for storing information. In order to ensure that a bubble is produced, the waveform must meet specific criteria including maintaining the waveform at or above 90% of the peak amplitude for a specific time, typically 50 to 200 nanoseconds. The rise time of the waveform is determined by the control amplifier.

Figure 1:
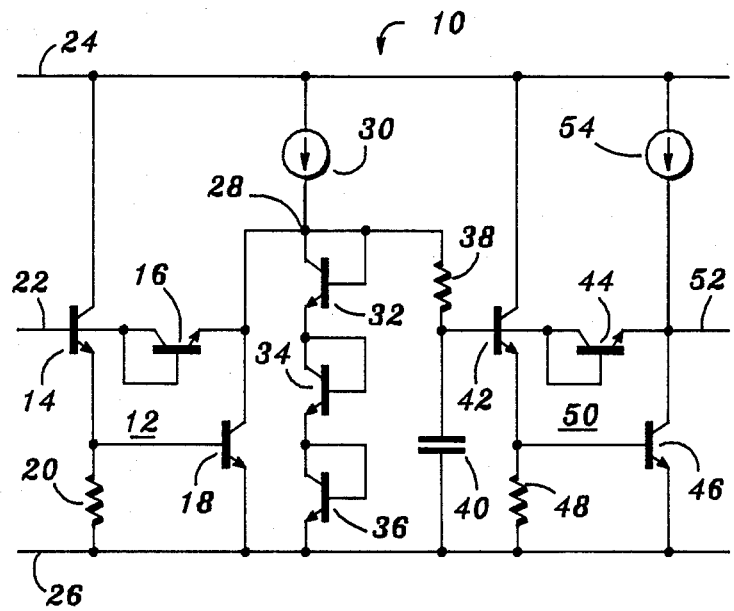
FIG. 1 is a schematic of the preferred embodiment of the invention.

Referring now to FIG. 1, a propagation delay generator 10 is shown that is suitable to be fabricated in integrated circuit form as well as with discrete components. The propagation delay generator 10 shown provides an output signal to a current ramp generator that will maintain the waveform at or above 90% of the peak amplitude for the required time. A gate 12, including transistors 14, 16, 18, and resistor 20, receives an input signal on conductor 22 to the base of transistor 14. The collector of transistor 14 is connected to voltage conductor 24 and its emitter is coupled to voltage conductor 26 by resistor 20. Voltage conductor 24 will have a more positive voltage than voltage conductor 26 using the NPN transistors as shown. Voltage conductor 26 may be grounded. The polarity of voltage conductors 24 and 26 may be reversed if other types of semiconductor devices are used. The base of transistor 14 is also connected to both the base and collector of diode connected transistor 16. The emitter of transistor 14 is also connected to the base of transistor 18. The emitter of transistor 18 is connected to voltage conductor 26 and its collector is connected to both the emitter of transistor 16 and node 28. Node 28 is coupled to voltage conductor 24 by current source 30. When an input signal on input conductor 22 of gate 12 is high, transistors 14 and 18 are turned on thereby pulling node 28 to $1V_{BE}$. Diode connected transistor 16 pulls excess base drive from transistor 14, thereby holding transistor 18 at $1V_{BE}$ and preventing saturation thereof. When the input at conductor 22 goes low, transistors 14 and 18 are turned off and current source 30 pulls node 28 to $3V_{BE}$. The $3V_{BE}$ value at node 28 is obtained due to series-diode connected transistors 32, 34 and 36. The collector and base of transistor 32 are connected to node 28 and its emitter is connected to the collector and base of transistor 34. Likewise, the emitter of transistor 34 is connected to the collector and base of transistor 36, while the emitter of transistor 36 is connected to voltage conductor 26.

The value of $3V_{BE}$ at node 28 is only shown by way of example, but could be adjusted to be any value compatible with the values of resistor 38 and capacitor 40. In the alternative, a circuit known to those skilled in the art as an $NV_{BE}$ network could be substituted for transistors 32, 34, and 36. By varying the value of the pair of resistors in parallel with a transistor in the $NV_{BE}$ network, any value of voltage may be obtained at node 28 necessary for proper operation of the circuit 10.

Node 28 is further connected to one side of resistor 38. The other side of resistor 38 is coupled to voltage conductor 26 by capacitor 40 and is connected to the base of transistor 42. Transistors 42, 44, 46 and resistor 48 are configured to form gate 50, similar to gate 12, that provides an output at output conductor 52. Transistor 42 has its collector connected to voltage conductor 24 and its emitter both coupled to voltage conductor 26 by resistor 48 and connected to the base of transistor 46. The base of transistor 42 is further connected to both the base and collector of diode connected transistor 44. Transistor 46 has its emitter connected to voltage conductor 26 and its collector connected to the emitter of transistor 44, output conductor 52 and coupled to voltage conductor 24 by current source 54.

Figure 2:
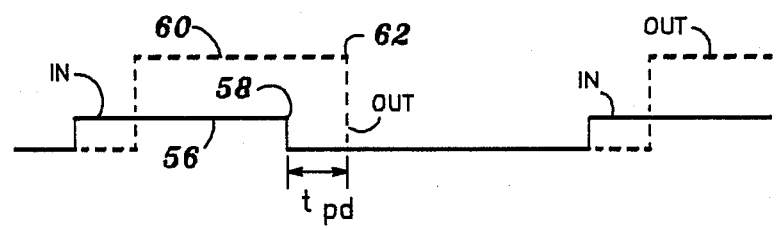
FIG. 2 is a diagram of the input and output pulses of the preferred embodiment of FIG. 1.

When node 28 goes to $3V_{BE}$, the $3V_{BE}$ charges capacitor 40 through resistor 38 to $2V_{BE}$. As the charge on capacitor 40 reaches $2V_{BE}$, dependent on the R-C time constant of resistor 38 and capacitor 40, the additional $1V_{BE}$ of the $3V_{BE}$ turns on transistor 42 and 46, pulling output conductor 52 to $1V_{BE}$. Diode connected transistor 44 pulls excess base drive from transistor 42, thereby holding transistor 46 or node 52 at one $1V_{BE}$ and preventing saturation thereof. This digital output at node 52 is typically forwarded to a current ramp generator that controls the waveform fall time. FIG. 2 illustrates the relationship of the digital input to the input conductor 22 and the digital output from output conductor 52. The time of propagation delay, $t_{pd}$, is seen to be the period between the fall of the input signal 56 at point 58 and the fall of the output signal 60 at point 62. The characteristics of $t_{pd}$ versus temperature are determined by the change in voltage at node 28 from $1V_{BE}$ to $3V_{BE}$ in conjunction with the temperature coefficient of resistor 38.

By now it should be appreciated that there has been provided an improved propagation delay generator that determines the duration of a pulse through the interaction of a changing voltage versus the temperature coefficient of a resistor.

Although the invention has been illustrated as having certain types of transistors, it will be understood that other types of transistors or semiconductor devices can be substituted to achieve the advantages of the present invention.

We claim:

1. A propagation delay generator circuit having a first voltage conductor, a second voltage conductor, an input conductor responsive to an input signal having a first and a second level, and an output conductor, for generating a delayed digital output signal responsive to said input signal, comprising:

input means coupled to said first voltage conductor, said second voltage conductor, said input conductor, and a first node, and responsive to said input signal for initializing a charging signal having a first voltage level at said first node when said input signal is at said first level;

capacitive means coupled to said first voltage conductor, said second voltage conductor, said first node, and a second node, and responsive to said charging signal for charging said first node to a second voltage level when said input signal is at said second level and for providing a gating signal having a third voltage level at said second node subsequent to receiving said charging signal; said capacitive means comprising:

a current source coupled between said first voltage conductor and said first node;

a resistor coupled between said first node and said second node; and a capacitor coupled between said second voltage conductor and said second node;

voltage level means coupled between said first node and said second voltage conductor for establishing said second voltage level at said first node; and output means coupled to said first voltage conductor, said second voltage conductor, and said second node, and responsive to said gating signal for providing said output signal.

2. The circuit according to claim 1 wherein said input means comprises:

a first transistor having a base, collector, and emitter, said base coupled to said input conductor, said collector coupled to said first voltage conductor, said emitter coupled to said second voltage conductor;

a second transistor having a base, collector, and emitter, said collector and base coupled together and to said base of said first transistor; and a third transistor having a base, collector, and emitter, said base coupled to said emitter of said first transistor, said emitter coupled to said second voltage conductor, said collector coupled to both said emitter of said second transistor and said first node.

3. The circuit according to claim 1 wherein said output means comprises:

a fourth transistor having a base, collector, and emitter, said base coupled to said second node, said collector coupled to said first voltage conductor;

a fifth transistor having a base, collector, and emitter, said collector and base coupled together and to said base of said fourth transistor; and a sixth transistor having a base, collector, and emitter, said base coupled to said emitter of said fourth transistor, said emitter coupled to said second voltage conductor, said collector coupled to said emitter of said fifth transistor and said first voltage conductor, said collector providing said output signal.

4. The circuit according to claim 1 wherein said voltage level means comprises a plurality of diode connected transistors coupled in series between said first node and said second voltage conductor.

5. The circuit according to claim 1 wherein said voltage level means comprises an $NV_{BE}$ network.

6. A propagation delay generator in a bubble memory system further having a control amplifier and a ramp generator, said control amplifier initiating a bubble generate waveform and an input signal having a first and a second level, said propagation delay generator having a first voltage conductor, a second voltage conductor, an input conductor responsive to said input signal, and an output conductor providing an output signal to said ramp generator, wherein the rise time of said bubble generate waveform is controlled by said control amplifier, said propagation delay generator controls the duration of said bubble generate waveform with a magnitude above a specific percentage of peak amplitude, said ramp generator controlling said bubble generate waveform fall time, said propagation delay generator comprising:

input means coupled to said first voltage conductor, said second voltage conductor, said input conductor, and a first node, and responsive to said input signal for initializing a charging signal having a first voltage level at said first node when said input signal is at said first level;

capacitive means coupled to said first voltage conductor, said second voltage conductor, said first node, and a second node, and responsive to said charging signal for charging said first node to a second voltage level when said input signal is at said second level and for providing a gating signal having a third voltage level at said second node subsequent to receiving said charging signal; said capacitive means comprising:

a resistor coupled between said first node and said second node; and a capacitor coupled between said second voltage conductor and said second node; and output means coupled to said first voltage conductor, said second voltage conductor, and said second node and responsive to said gating signal for providing said output signal, wherein the bubble generate waveform is maintained at a magnitude above a specified percentage of peak amplitude during the time between said input signal and said output signal.

* * * * *